US 6,563,106 B1

(12) United States Patent
Bowers et al.

(10) Patent No.: US 6,563,106 B1
(45) Date of Patent: May 13, 2003

(54) MICRO-ELECTRO-MECHANICAL-SYSTEM (MEMS) MIRROR DEVICE AND METHODS FOR FABRICATING THE SAME

(75) Inventors: John Edward Bowers, Santa Barbara; Roger Jonathan Helkey, Montecito; Charles Corbalis, Saratoga; Robert Kehl Sink, Santa Barbara, all of CA (US); Seung Bok Lee, Ithaca, NY (US); Noel MacDonald, Santa Barbara, CA (US)

(73) Assignee: Calient Networks, Inc., San Jose, CA (US)

( * ) Notice: Subject to any disclaimer, the term of this patent is extended or adjusted under 35 U.S.C. 154(b) by 0 days.

(21) Appl. No.: 09/929,900

(22) Filed: Aug. 14, 2001

Related U.S. Application Data

(62) Division of application No. 09/497,270, filed on Feb. 1, 2000.

(51) Int. Cl.[7] .................................................. H01J 3/14
(52) U.S. Cl. ..................... 250/216; 250/208.1; 359/291
(58) Field of Search ................................. 250/216, 239, 250/208.1; 359/290, 291, 295, 223; 438/22; 174/253

(56) References Cited

U.S. PATENT DOCUMENTS

| 3,493,820 A | 2/1970 | Rosvold |
| 4,104,086 A | 8/1978 | Bondur et al. ............... 148/1.5 |
| 4,365,863 A | 12/1982 | Broussaud |

(List continued on next page.)

FOREIGN PATENT DOCUMENTS

| DE | 4224601 A1 | 1/1994 |
| DE | 19757181 A1 | 12/1997 |
| DE | 19800745 A1 | 1/1998 |

(List continued on next page.)

OTHER PUBLICATIONS

Mihailovich, Zhang, Shaw, MacDonald, "Single–Crystal Silicon Torsional Resonators", 0–7803–0957–2/93, 1993 IEEE p. 184–188.

Hoffmann, W., Lee, C.S., and MacDonald, N.C., Monolithic Three–Dimensional Single Crystal Silicon Microelectromechanical Sytems;, Sensors and Materials, 10, 337–350 (1998), (Month Unknown).

Field, L.A., et al., "Micromachined 1x2 optical fiber switch", Sensors and Actuators A, 53, 311–315 (1996), (Month Unknown).

Hornbeck, L.J. "Digital Light Processing for high–brightness, high–resolution appiations", SPIE vol. 3013, San Jose, CA, pp. 27–40, Feb. 1997.

(List continued on next page.)

Primary Examiner—Que T. Le
(74) Attorney, Agent, or Firm—Blakely, Sokoloff, Taylor & Zafman LLP

(57) ABSTRACT

A micro-electro-mechanical-system (MEMS) mirror device and methods for fabricating the same allow for a large range of angular motion for a center mirror component. The large range of angular motion for a center mirror component is dictated simply by a thickness of a substrate used or a thickness of a thick film used in making a support structure to support the center mirror component. The MEMS mirror device and methods for fabricating the same allow a large number mirror devices to be fabricated on a substrate. The MEMS mirror device includes a substrate. Electrodes are formed supported by the substrate. A support structure is formed adjacent to the electrodes. A hinge pattern and a mirror pattern having a center mirror component are formed such that the support structure supports the hinge pattern and mirror pattern. The support structure also supports the hinge pattern and mirror pattern such that a bottom surface of the center mirror component in a stationary non-rotating position is capable of exceeding a height of 50 $\mu$m above the electrodes.

68 Claims, 10 Drawing Sheets

U.S. PATENT DOCUMENTS

| | | | |
|---|---|---|---|
| 4,421,381 A | 12/1983 | Ueda et al. | 350/6.6 |
| 4,509,249 A | 4/1985 | Goto et al. | 29/576 |
| 4,519,128 A | 5/1985 | Chesebro et al. | 29/576 |
| 4,553,436 A | 11/1985 | Hansson | 73/517 |
| 4,571,819 A | 2/1986 | Rogers et al. | 156/643 |
| 4,598,585 A | 7/1986 | Boxenborn | 73/505 |
| 4,654,663 A | 3/1987 | Alsenz et al. | 340/870.3 |
| 4,688,069 A | 4/1987 | Joy et al. | 357/34 |
| 4,670,092 A | 6/1987 | Motomedi | 156/643 |
| 4,706,374 A | 11/1987 | Murakami | 437/225 |
| 4,784,720 A | 11/1988 | Douglas | 156/643 |
| 4,838,631 A | 6/1989 | Chande et al. | |
| 4,851,080 A | 7/1989 | Howe et al. | 156/647 |
| 4,855,017 A | 8/1989 | Douglas | 156/643 |
| 4,876,217 A | 10/1989 | Zdebel | 437/67 |
| 4,922,756 A | 5/1990 | Henrion | 73/517 R |
| 4,932,745 A | 6/1990 | Blonder | |
| 5,016,072 A | 5/1991 | Greiff | 357/26 |
| 5,068,203 A | 11/1991 | Logsdon et al. | 437/89 |
| 5,095,752 A | 3/1992 | Suzuki et al. | 73/517 |
| 5,097,354 A | 3/1992 | Goto | 359/214 |
| 5,121,180 A | 6/1992 | Beringhause et al. | 357/26 |
| 5,126,812 A | 6/1992 | Greiff | 359/25 |
| 5,172,262 A | 12/1992 | Hornbeck | 359/223 |
| 5,083,857 A | 1/1993 | Hornbeck | 359/291 |
| 5,198,390 A | 3/1993 | MacDonald et al. | 437/203 |
| 5,203,208 A | 4/1993 | Bernstein | 73/505 |
| 5,226,321 A | 7/1993 | Varnham et al. | 73/505 |
| 5,235,187 A | 8/1993 | Arney et al. | 250/306 |
| 5,287,082 A | 2/1994 | Arney et al. | 338/307 |
| 5,316,979 A | 5/1994 | MacDonald et al. | 437/203 |
| 5,393,375 A | 2/1995 | MacDonald et al. | 156/643 |
| 5,397,904 A | 3/1995 | Arney et al. | 257/66 |
| 5,399,415 A | 3/1995 | Chen et al. | 428/209 |
| 5,426,070 A | 6/1995 | Shaw et al. | 437/203 |
| 5,427,975 A | 6/1995 | Sparks et al. | 437/79 |
| 5,428,259 A | 6/1995 | Suzuki | 310/309 |
| 5,444,566 A | 8/1995 | Gale et al. | |
| 5,449,903 A | 9/1995 | Arney et al. | 250/306 |
| 5,454,906 A | 10/1995 | Baker et al. | |
| 5,483,158 A | 1/1996 | van Heteren et al. | 324/318 |
| 5,488,862 A | 2/1996 | Neukermans et al. | 73/504.02 |
| 5,501,893 A | 3/1996 | Laermer et al. | 428/161 |
| 5,536,988 A | 7/1996 | Zhang et al. | 310/309 |
| 5,563,343 A | 10/1996 | Shaw et al. | 73/514.18 |
| 5,583,373 A | 12/1996 | Ball et al. | |
| 5,610,335 A | 3/1997 | Shaw et al. | 73/514.36 |
| 5,611,888 A | 3/1997 | Bosch et al. | 156/643.1 |
| 5,611,940 A | 3/1997 | Zettler | 73/514.16 |
| 5,628,917 A | 5/1997 | MacDonald et al. | 216/2 |
| 5,629,790 A | 5/1997 | Neukermans et al. | 359/198 |
| 5,637,189 A | 6/1997 | Peeters et al. | 438/466 |
| 5,645,684 A | 7/1997 | Keller | 156/643.1 |
| 5,670,881 A | 9/1997 | Arakawa et al. | 324/322 |
| 5,673,139 A | 9/1997 | Johnson | 359/291 |
| 5,703,728 A | 12/1997 | Smith et al. | |
| 5,719,073 A | 2/1998 | Shaw et al. | 437/228 |
| 5,726,073 A | 3/1998 | Zhang et al. | 437/228 |
| 5,759,913 A | 6/1998 | Fulford, Jr. et al. | 438/624 |
| 5,770,465 A | 6/1998 | MacDonald et al. | 437/67 |
| 5,798,557 A | 8/1998 | Salatino et al. | 257/416 |
| 5,804,084 A | 9/1998 | Nasby et al. | 216/2 |
| 5,846,849 A | 12/1998 | Shaw et al. | 438/52 |
| 5,847,454 A | 12/1998 | Shaw et al. | 257/734 |
| 5,869,916 A | 2/1999 | Suzuki et al. | 310/309 |
| 5,907,425 A | 5/1999 | Dickensheets et al. | |
| 5,915,168 A | 6/1999 | Salatino et al. | 438/110 |
| 5,920,417 A | 7/1999 | Johnson | 359/223 |
| 5,933,746 A | 8/1999 | Begley et al. | 438/405 |
| 5,943,157 A | 8/1999 | Florence et al. | |
| 5,969,848 A | 10/1999 | Lee et al. | 359/298 |
| 5,998,816 A | 12/1999 | Nakaki et al. | 257/254 |
| 5,998,906 A | 12/1999 | Jerman et al. | 310/309 |
| 5,999,303 A | 12/1999 | Drake | |
| 6,000,280 A | 12/1999 | Miller et al. | 73/105 |
| 6,020,272 A | 2/2000 | Fleming | 438/734 |
| 6,028,690 A | 2/2000 | Carter et al. | |
| 6,044,705 A | 4/2000 | Neukermans et al. | |
| 6,201,631 B1 | 4/2000 | Greywall | 359/245 |
| 6,072,617 A | 6/2000 | Henck | |
| 6,075,639 A | 6/2000 | Kino et al. | |
| 6,097,860 A | 8/2000 | Laor | 385/17 |
| 6,101,299 A | 8/2000 | Laor | 385/16 |
| 6,121,552 A | 9/2000 | Brosnihan et al. | 174/253 |
| 6,137,926 A | 10/2000 | Maynard | |
| 6,229,640 B1 * | 5/2001 | Zhang | 359/290 |
| 6,239,473 B1 | 5/2001 | Adams et al. | 257/419 |
| 6,253,001 B1 | 6/2001 | Hoen | |
| 6,262,827 B1 | 7/2001 | Ueda et al. | |

FOREIGN PATENT DOCUMENTS

| | | |
|---|---|---|
| EP | 0 834759 A2 | 4/1998 |
| EP | 0 980014 A1 | 2/2000 |
| EP | 1 120677 A2 | 8/2001 |
| GB | 2175705 A | 12/1986 |
| GB | 2 239 101 A | 6/1991 |
| GB | 20275 787 A | 9/1994 |
| JP | 60-107017 | 6/1985 |
| JP | 5-107485 A | 4/1993 |
| JP | 6-180428 | 6/1994 |
| WO | WO 94/18697 | 8/1994 |
| WO | wo 97/04283 | 2/1997 |
| WO | WO 99/36941 | 7/1999 |
| WO | WO 99/36948 | 7/1999 |
| WO | WO 99/67666 | 12/1999 |
| WO | WO 01/33898 | 5/2001 |

OTHER PUBLICATIONS

Webb, R.Y., Adams, S.G., and MacDonald, N.C., "Suspended thermal oxide trench islation for SCS MEMS", SPIE, vol. 3519, Boston, MA pp. 196–199, Nov. 1998.

Shaw, K.A., Zhang Z.L., and MacDonald, N. "SCREAM 1: a single mask, single–crystal silicon, reactive ion etching process for microelectromechanical structures", Sensors & Actuators A, 40, 63–70 (1994) (Month Unknown).

Ming C. Wu, "MEMS for Optical and RF Applications", Nov. 1–3, 1999, Engineering: 823.52, UCLA Extension, Department of Engineering, Information Systems, and Technical Management.

Timothy J. Broshnihan, James M. Bustillo, Albert P. Pisano & Roger T. Howe, "Embedded Interconnect & Electrical Isolation for High–Aspect–Ratio, SOI Inertial Instruments," Berkeley Sensor & Actuator Sensor, pp. 637–640, Transducers '97 1997 International Conference on Solid–State Sensors and Actuators (Chicago, Jun. 16–19, 1997).

Wolfgang Kuehnel and Steven Sherman, "A Surface Micromachined Silicon Acclerometer with On–Chip Detection Circuitry," Sensors and Actuators A 45, pp. 7–16 (1994) Month unknown.

Lynn Michelle Roylance and James B. Angelll, "A Batch–Fabricated Silicon Accelerometer," IEEE Transactions on Electron Devices, vol. Ed.–26, No. 12, pp. 1911–1917 (December 1979).

Toshiki Hirano, et al, "Design, Fabrication, and Operation of Subnmicron Gap Comb–Drive Microactuators," J. of Microelectromechanical Systems, vol. 1, No. 1, pp. 52–59, (Mar. 1992).

V.P. Jaecklin. et al., "Comb Actuators for XY–Microstages," Sensors and Actuator A, 39, pp. 83–89 (1993) Month unknown.

Susanne C. Arney and Noel C. MacDonald, et al., "Formation of Submicron Silicon–On–Insulator Sructures by Lateral Oxidation of Substrate–Silicon Islands," J. Vac. Sci. Technol. B vol. 6 No. 1, pp. 341–345, (Jan/Feb 1988).

"Lucent's New All–Optical Router Uses Bell Labs Microscopic Mirrors," Bells Labs press release, pp. 1–4, Nov. 10, 1999. http://www.bell-labs.com/news/1999/nov./10/1.html.

Chris Seung–Bok Lee, Sejin Han, Noel C. MacDonald, "Multiple Depth, Single Crystal Silicon MicroActuators for Large Displacement Fabricated by Deep Reactive Ion Etching, " Solid–State Sensor and Actuator Workshop, Hilton Head Island, SC, pp. 45–50 (Jun. 8–11, 1998).

William C. Tang, Martin G. Lim, and Roger T. Howe, "Electrostatic Comb Drive Levitation and Control Method" Journal of Microelectromechanical Systems, vol. 1, No. 4, pp. 170–178 (Dec. 1992).

M.C. Wu, L.–Y. Lin, S.–S. Lee, and K.S.J.Pister, "Micromachined Free–Space Integrated Micro–Optics," Sensors and Actuators A, 50, pp. 127–134 (1995) Month unknown.

Joseph E. Ford, Vladimir A. Aksyuk, David J. Bishop, and James A. Walker, "Wavelength Add–Drop Switching Using Tilting Micromirrors," Journal of Lightwave Technology, vol. 17, No. 5, pp. 904–911 (May 1999).

Cornel Marxer and Nicolaas F. de Rooij, "Micro–Opto–Mechanical 2x2 Switch for Single–Mode Fibers Based on Plasma–Etched Silicon Mirror and Electrostatic Actuation, "Journal of Lightwave Technology, vol. 17, No. 1, pp. 2–6 (Jan. 1999).

M.T.A. Salf and N. C. MacDonald, "Planarity of Large Mems,"Journal of Microelectromechanical Sysems, 5, 79–97 (1996).

W.–H. Juan and S.W. Pang, "High–aspect–ratio Si Vertical Micromirror Arrays for Optical Switching,"Journal of MicroElectroMechanical Systems, 7, 207, –213 (1998) Month unknown.

Rob Legtenberg, et al., "Comb–drive actuators for large displacements,"Journal of Micromechaniss and Microengineering, vol. 6, No. 2, pp.320–329, Jun. 1996.

Chris S.B. Lee, Sejin Han, and Noel C. MacDonald, "Single Crystal Silicon (SCS) XY–Stage Fabricated by DRIE and IR alignment,"MEMS 2000: The Thirteenth Annual International Conference on Micro Electro Mechanical Systms, pp. 28–33 (Jan. 23–27, 2000).

Chris S.B. Lee, Russell Y. Webb, John M. Chong, and Noel C. MacDonald, "Single Crystal Silicon (SCS) Micro Mirror Arrays using Deep Silicoon Etching and IR Alignment, "MEMS 2000: The Thirteenth Annual International Conference on Micro Electro Mechanical Systems, pp. 441–448 (Jan. 23–27, 2000).

Noel C. MacDonald, "Scream MicroElectroMechanical Systems."Microelectronic Engineering, 32, pp. 49–73 (1996) Month unknown.

Seung Chris B. Lee, "Two–Depth, Single Crystal Silicon Microelectromechanical Systems."A Dissertation Presented to the Faculty of the Graduate School of Cornell University in Partial Fulfillment of the Requirements for the Degree of Doctor of Philosophy, pp. l–xxi and pp. 1–144 (Jan. 2000).

David A. Koester, Ramaswamy Mahadevan, Alex Shishkoff, and Karen W. Markus, "MUMPs Design Handbook, "Version 4.0, Cronos Integrated Microsystems, Research Triangle Park, NC 27709, PP. 1–37 (May 1999).

* cited by examiner

MICRO-ELECTRO-MECHANICAL-SYSTEM (MEMS) MIRROR DEVICE AND METHODS FOR FABRICATING THE SAME

This Application is a Divisional and claims priority to U.S. patent application Ser. No. 09/497,270 entitled "A MICRO-ELECTRO-MECHANICAL-SYSTEM (EMS) MIRROR DEVICE AND METHODS FOR FABRICATING THE SAME," filed on Feb. 1, 2000, the disclosure of which is hereby incorporated herein by reference.

FIELD OF THE INVENTION

The present invention pertains to the field of micro-electro-mechanical-system (MEMS) devices. More particularly, the present invention relates to a MEMS mirror devices and methods for fabricating the same.

BACKGROUND OF THE INVENTION

A MEMS device is a micro-sized mechanical structure having electrical circuitry fabricated using conventional integrated circuit (IC) fabrication methods. A well-known MEMS device is a microscopic gimbaled mirror mounted on a substrate. A gimbaled mirror is a device that may pivot on a hinge about an axis. By pivoting about an axis, a gimbaled mirror can redirect light beams to varying positions. Typically, MEMS gimbaled mirrors are arranged in an array on single silicon wafer substrate.

A prior process for fabricating MEMS gimbaled mirrors on a substrate is a surface micro-machining process. A surface micro-machining process-utilizes thin layers to mount the MEMS mirrors off the substrate. A disadvantage with using the micro-machining process is that the gimbaled mirrors are mounted by only a few $\mu$m ("micro-meters") off the substrate. At such a small height, the gimbaled mirror is inhibited from pivoting at large angles with respect to an axis thereby limiting the number of positions for redirecting light.

One kind of micro-machining process to make gimbaled mirrors is the stress curling method. The stress curling method applies a stress gradient on a thin cantilever layer. The stress gradient causes the end of the cantilever layer to curl that is used to lift a gimbaled mirror off the substrate. A disadvantage with using the stress curling method is that it is process dependent and it is difficult to control the stress gradient. Another disadvantage with the stress curling method is that cantilever layer requires a large area on the substrate that reduces the number of gimbaled mirrors that can be arranged on the substrate.

Another kind of micro-machining process to make gimbaled mirrors utilizes hinges and scratch motors. A scratch motor uses electrostatic force to move a mass that raises a gimbaled mirror off the substrate by rotating the mass around a hinge. A disadvantage with using scratch motors and hinges is that it requires a large area of space on the substrate to make the scratch motors and hinges thereby limiting the number of gimbaled mirrors to be arranged on the substrate. Furthermore, scratch motors are difficult to make at a microscopic level.

SUMMARY OF THE INVENTION

A micro-electro-mechanical-system (MEMS) mirror device is disclosed. The MEMS mirror device includes a substrate. Electrodes are formed supported by the substrate. A support structure is formed adjacent to the electrodes. A hinge pattern and a mirror pattern having a center mirror component are formed such that support structure supports the hinge pattern and mirror pattern. The support structure also supports the hinge pattern and mirror pattern such that a bottom surface of the center mirror component in a stationary non-rotating position is capable of exceeding a height of 50 $\mu$m above the electrodes.

A MEMS mirror device fabrication method is disclosed. A substrate is exposed selectively to form exposed regions and unexposed regions in the substrate. Electrodes are formed supported by the substrate. A mirror pattern having a center mirror component and a hinge pattern are formed supported by the substrate. Portions of the substrate are removed in the exposed regions to form a support structure from the unexposed regions such that the support structure supports the mirror pattern and hinge pattern.

Another method for fabricating a MEMS mirror device is disclosed. A release layer is formed on a first substrate. A mirror pattern having a center mirror component and a hinge pattern are formed supported by the release layer. Electrodes are formed supported by a second substrate. A support structure is formed. The first substrate is attached with the second substrate using the support structure. The first substrate and the release layer are removed such that the support structure supports the mirror pattern and hinge pattern.

Another method for fabricating a MEMS mirror device is disclosed. A release layer is formed on a first substrate. A mirror pattern having a center mirror component and a hinge pattern are formed supported by the release layer. Electrodes are formed supported by a second substrate. A support structure is formed using a third substrate. The first substrate is attached with the second substrate using the support structure. The first substrate and release layer are removed.

Another method for fabricating a MEM gimbaled mirror device is disclosed. Electrodes are formed supported by a first substrate. Portions of a second substrate on a bottom side are removed selectively. Portions of the second substrate on a topside are removed selectively to form a mirror, frame pattern, and hinge pattern. The first substrate is attached with the second substrate.

Other features and advantages of the present invention will be apparent from the accompanying drawings, and from the detailed description, which follows below.

BRIEF DESCRIPTION OF THE DRAWINGS

The present invention is illustrated by way of example and not limited in the figures of the accompanying drawings in which like references indicate similar elements and in which.

DETAILED DESCRIPTION

Figure 1:
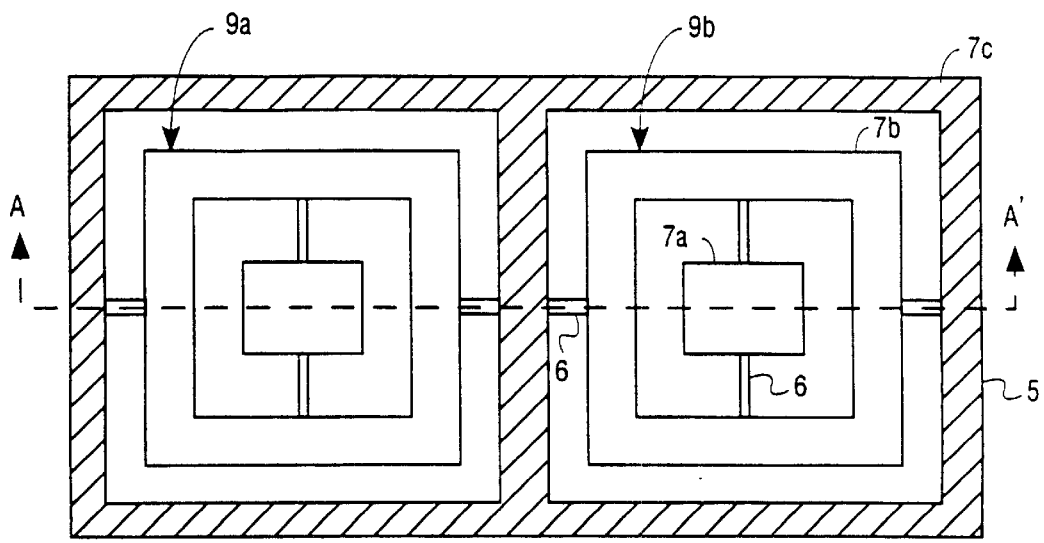
FIG. 1 is a top view of a MEMS mirror device according to one embodiment without electrodes and a wiring pattern.

A micro-electro-mechanical-system (MEMS) mirror device is described that includes a substrate. Electrodes are formed supported by the substrate. A support structure is formed adjacent to the electrodes. A hinge pattern is formed on the support structure. A hinge pattern and a mirror pattern having a center mirror component are formed such that support structure supports the hinge pattern and mirror pattern. The support structure also supports the hinge pattern and mirror pattern such that a bottom surface of the center mirror component in a stationary non-rotating position is capable of exceeding a height of 50 μm above the electrodes. For example, the support structure may support the hinge pattern and mirror pattern such that the bottom surface of the center mirror component in a stationary non-rotating position has a height of about 100 μm above the electrodes.

By having a center mirror component capable of exceeding a height of 50 μm above the electrodes, the center mirror component may have a larger angular range of motion that can pivot about an axis. For example, the center mirror component is capable of having an angular range of motion exceeding 20 degrees with respect to an axis. Because the center mirror component may have such a large range of angular motion, the center mirror component may redirect light beams at a larger number of positions. Thus, such a MEMS mirror device having a large angular motion can provide increased flexibility for optical switching systems, scanning systems, printing systems, and display systems that require redirecting beams of light.

The methods for fabricating a MEMS mirror device as described herein allow for a large number of mirror devices to be arranged on a single substrate. The methods for fabricating a MEMS mirror device also allow the center mirror component to be at a desired height above the electrodes or substrate dictated simply by a thickness of a substrate or a thickness of a formed support structure.

For a first embodiment, a MEMS mirror device fabrication method exposes selectively a substrate to form exposed regions and unexposed regions. Electrodes are formed supported by the substrate. A mirror pattern having a center mirror component and a hinge pattern are formed supported by the substrate. Portions of the substrate are removed in the exposed regions to form a support structure from the unexposed regions such that the support structure supports the mirror pattern and hinge pattern.

For the first embodiment, a single substrate is used to fabricate a MEMS mirror device. The single substrate is used to form the electrodes, mirror pattern, hinge pattern, and support structure. The height at which a center mirror component is above the electrodes is dictated by the thickness of the substrate.

For a second embodiment, a MEMS mirror device fabrication method forms a release layer on a first substrate. A mirror pattern having a center mirror component and a hinge pattern are formed supported by the release layer. Electrodes are formed supported by a second substrate. A support structure is formed. The first substrate and the second substrate are attached using the support structure. The first substrate and the release layer are removed such that the support structure supports the mirror pattern and hinge pattern.

For the second embodiment, two substrates are used to fabricate a MEMS mirror device. The height at which the center mirror component is above the electrodes is dictated by a thickness of the formed support structure. Thus, to increase the height of the of the center mirror component above the electrodes, a thicker support structure is formed. As such, the thickness of the support structure formed dictates the height at which a center component is above the electrodes.

For a third embodiment, a MEMS mirror device fabrication method forms a release layer on a first substrate. A mirror pattern having a center mirror component and a hinge pattern are formed supported by the release layer. Electrodes are formed supported by a second substrate. A support structure is formed using a third substrate. The first substrate is attached with the second substrate using the support structure. The first substrate and release layer are removed.

For the third embodiment, three substrates are used to fabricate a MEMS mirror device. A first substrate is used to form the hinge pattern and mirror pattern. A second substrate is used to form the electrodes. A third substrate is used to form the support structure. The thickness of the third substrate used dictates the thickness of the support structure. Thus, the height at which the center mirror component is above the electrodes is simply dictated by the thickness of the gird substrate. Thus, to increase the height of the of the center mirror component above the electrodes, a thicker third substrate is simply used.

For a fourth embodiment, a MEMS mirror device fabrication method forms electrodes supported by a first substrate. Portions of a second substrate are removed selectively on a bottom side. Portions of the second substrate are removed selectively on a topside to form a mirror pattern, frame pattern, hinge pattern, and support structure. The first substrate is attached with the second substrate.

For the fourth embodiment, two substrates are used to fabricate a MEMS mirror device. The height at which the center mirror component is above the electrodes is dictated by the thickness of the second substrate used. Furthermore, the mirror pattern, frame pattern, hinge pattern, and support structure can be formed from a single substrate.

For all the embodiments, a layer can be selectively patterned on a substrate using any combination of a photolithography and dry or wet etching process or a liftoff process. A liftoff process involves depositing a photosensitive film over a substrate that is then exposed and developed to pattern the photosensitive film. Material is then deposited over the entire surface the substrate and on the patterned photosensitive film. After the material is deposited over the substrate and on the patterned photosensitive film, the patterned photosensitive film is dissolved and any material formed thereon is removed. As a result of this process, the material deposited is selectively patterned. Furthermore, a layer may also be removed or released by using oxygen plasma that reacts with the layer to release or remove the layer from an attached material.

FIG. 1 is top view of one embodiment of a MEMS mirror device without electrodes and a wiring pattern illustrating a first mirror device 9A and a second mirror device 9B having a support structure 5, hinge pattern 6, and mirror pattern 7. Mirror pattern 7 may include a center mirror component 7a, frame pattern 7b, and mirror component 7c. Center mirror component 7a is capable of having an angular range of motion with respect to an axis. Frame pattern 7b provides support for center mirror component 7a. Mirror component 7c may be used for alignment or bonding purposes. Alternatively, mirror component 7c may be omitted from mirror pattern 7.

Figure 2:
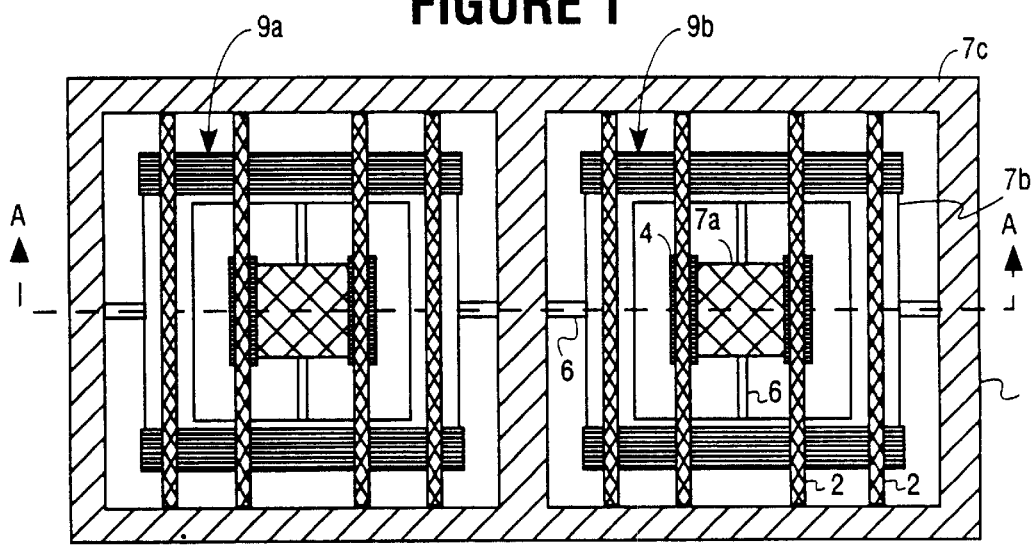
FIG. 2 is a top view of a MEMS mirror device according to one embodiment illustrating electrodes and a wiring pattern.

FIG. 2 is a complete top view of one embodiment of a MEMS mirror device such as that shown in FIG. 1 further illustrating electrodes 4 and wiring pattern 2 for the first mirror device 9A and second mirror device 9B.

Figure 3:
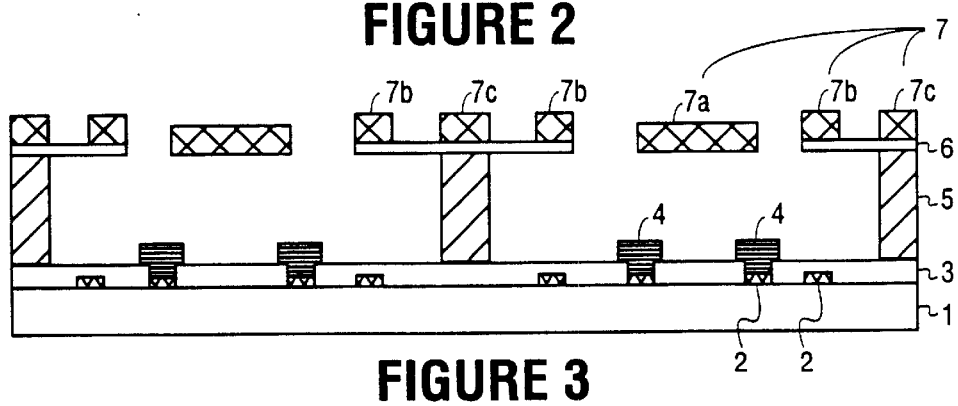
FIG. 3 is a cross-sectional side view of one embodiment along the line A–A' such as that shown in FIG. 2.

FIG. 3 is a cross sectional side view showing the structure of one embodiment of a MEMS mirror device taken along the line A–A' such as that shown in FIG. 2. As shown in FIG. 3, a MEMS mirror device includes a substrate 1 having wiring pattern 2 formed thereon. Electrodes 4 are formed such that electrodes are coupled with wiring pattern 2. An insulation layer 3 is formed to provide insulation for wiring pattern 2 and electrodes 4.

Support structure 5 is formed on insulation layer 3 adjacent from electrodes 4. Support structure 5 may include a post structure to provide support for layers formed thereon or attached therewith. Support structure 5 may define a honeycombed shape. Support structure 5 may also define holes such that the holes are centered approximately below the center mirror component. Support structure 5 provides support for hinge pattern 6 and mirror pattern 7.

Mirror pattern 7 includes a center mirror component 7a, frame pattern 7b, and mirror component 7c. Alternatively, mirror pattern may include center mirror component 7a and frame pattern 7b. Hinge pattern 6 is attached with mirror pattern 7 and support structure 5. Hinge pattern 6 may be a thin and flexible material. Hinge pattern 6 provides support for mirror pattern 7. Frame pattern 7b provides support for center mirror component 7a. Mirror component 7c is supported by hinge pattern 6 and may be used for alignment or bonding purposes. Alternatively, mirror component 7c may be omitted from mirror pattern 7.

The center mirror component 7a is formed such that it is disposed above electrodes 4. Center mirror component 7a includes a reflective surface to reflect beams of light. Electrodes 4 are located below at opposing edges of center mirror component 7a. Center mirror component 7a may also be connected with a ground line (not shown) in substrate 1 for electrical shielding purposes. Electrodes 4 are coupled with a respective wiring pattern 2 located on substrate 1. Alternatively, a ground line may be disposed between electrodes 4 and wiring pattern 2 for purposes of electrical shielding.

Center mirror component 7a may move about an axis to have an angular range of motion caused by electrostatic actuation from electrodes 4. Electrostatic actuation is caused by a voltage being applied to electrodes 4 through wiring pattern 2. A voltage applied to electrodes 4 creates an electric field between, for example, electrodes 4 and center mirror component 7a. Typically, the electric field is created near the edges of center mirror component 7a. The electric field causes center mirror component 7a to have an angular range of motion with respect to an axis such as, for example, an axis parallel to hinge pattern 7. The edges of center mirror component 7a towards electrodes 4 at which the voltage is applied moves towards such electrodes 4.

By increasing the angular range of motion for center mirror component 7a, center mirror component 7a can redirect beams of light to a larger number of positions thereby increasing flexibility for optical switching. Increasing the thickness for support structure 5 can increase the angular range of motion for center mirror component 7a. Support structure 5 having an increased thickness provides a larger height for center mirror component 7a to be off of substrate 1. Because center mirror component 7a may have a large height off substrate 1, center mirror component 7a is provided with a larger angular range of motion.

For the following embodiments, the support structure can be fabricated to support the hinge pattern and mirror pattern such that a bottom surface of the center mirror component in a stationary non-rotating position is capable of exceeding a height of 50 $\mu$m above the electrodes. Also, in the following embodiments, the support structure may support the hinge pattern and mirror pattern such that the bottom surface of the center mirror component in a stationary non-rotating position is capable of having a height about 100 $\mu$m above the electrodes. At such heights, the following embodiments provide a center mirror component that is capable of having an angular range of motion exceeding 20 degrees with respect to an axis.

FIGS. 4a through 4f are cross-sectional side views illustrating process steps of a method for fabricating the MEMS mirror device according to a first embodiment.

Figure 4A:
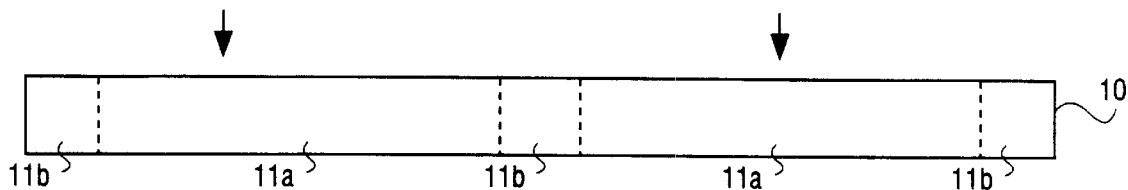
FIGS. 4a through 4f are cross-sectional side views illustrating process steps of a method for fabricating the MEMS mirror device according to a first embodiment.

Referring to FIG. 4a, substrate 10 is exposed selectively on a first side to form exposed regions 11a and unexposed regions 11b in substrate 10. A honeycombed mask may be used to expose selectively substrate 10. Alternatively, other masks may be used to form exposed regions on a substrate such that mirror components are centered approximately over the exposed regions. For purposes of illustration, the first side is a topside of substrate 10.

Substrate 10 is a substrate that can be etched more rapidly in the exposed regions than in the unexposed regions. For example, substrate 10 may be a photosensitive glass substrate that can be exposed selectively and etched more rapidly in the exposed regions than in the unexposed regions. After being exposed selectively, substrate 10 may be polished to retain planarity and remove any materials that may have formed on substrate 10 during this process.

Figure 4B:
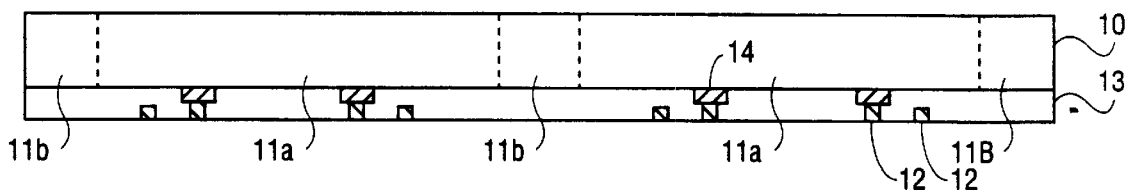

Referring to FIG. 4b, a first metal layer is formed on a second side of substrate 10 and is selectively patterned and etched to form electrodes 14. For purposes of explanation, the second side is a bottom side of substrate 10. The first metal layer may be a metallic layer such as, for example, an aluminum Al layer. After forming electrodes 14, an oxide layer is then formed over electrodes 14 and substrate 10 on the bottom side and selectively patterned to form insulation layer 13, such that insulation layer 13 exposes portions of electrodes 14. Alternatively, other dielectric layers may be used such as, for example, silicon dioxide $SiO_2$ layer, silicon nitride $Si_xN_y$ layer, or silicon oxynitride $Si_xO_yN_z$ layer, that can be selectively patterned and etched to form insulation layer 13.

After forming insulation layer 13, a second metal layer is formed on insulation layer 13 and on exposed portions of electrodes 14 and is selectively patterned and etched to form wiring pattern 12. The second metal layer may also be a metallic layer such as, for example, an Al layer. Wiring pattern 12 is formed such that it is coupled with electrodes 14. Insulation layer 13 provides insulation for wiring pattern 12 and electrodes 14.

Figure 4C:
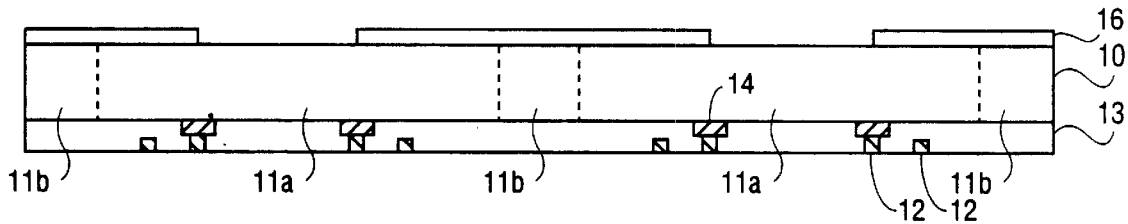

Referring to FIG. 4c, a polysilicon layer is formed on the topside of substrate 10. The polysilicon layer is selectively patterned and etched to form hinge pattern 16. Alternatively, a polymer layer, oxide layer, nitride layer, silicon nitride $Si_xN_y$ layer, silicon dioxide $SiO_2$, layer, or silicon oxynitride $Si_xO_yN_z$ layer may be used that is selectively patterned and etched to form hinge pattern 16. Hinge pattern 16 is formed to be thin and flexible. Hinge pattern 16 is also formed such that portions of substrate 11 are exposed above an area near electrodes 14.

Figure 4D:
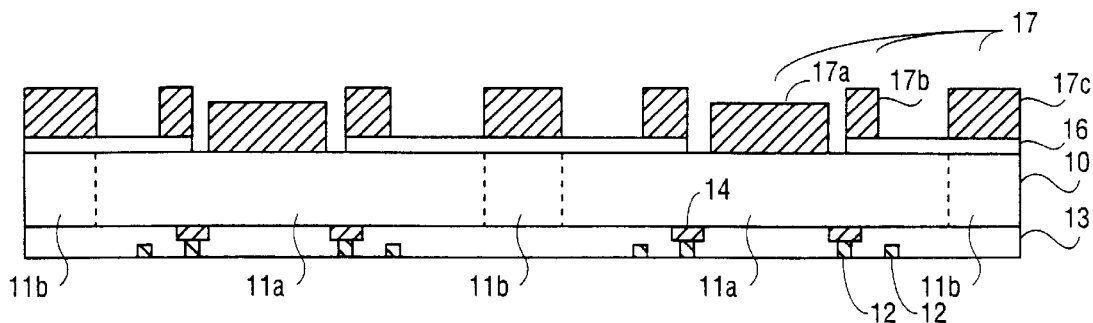

Referring to FIG. 4d, at least one layer having light reflective properties is formed on hinge pattern 16 and on the exposed portions of the topside of substrate 11. For example, a metal layer having light reflective properties may be formed on hinge pattern 16 and portions of the exposed substrate 11 and selectively pattern and etched to form mirror pattern 17. The metal layer may be a gold Au metal layer, aluminum Al metal layer, or a copper Cu metal layer. Mirror pattern 17 includes a center mirror component 17a, frame pattern 17b, and mirror component 17c. Frame pattern 17b is supported by hinge pattern 16. Frame pattern 17b provides support for center mirror component 17a. Mirror component 17c is supported by hinge pattern 16. Alternatively, mirror component 17c may be omitted from mirror pattern 17.

Multiple layers may also be used to form mirror pattern 17. For example, a first metal layer is formed on hinge pattern 17 and on portions of the exposed substrate 11. A support layer is formed on the first metal layer. A second metal layer is formed on the support layer. The three layers are selectively patterned and etched to form mirror pattern 17.

The first and second metal layers are layers having light reflective properties. For example, a gold Au metal layer, an aluminum Al metal layer, or a copper Cu metal layer may be used for the first and second metal layers. The support layer is a layer that provides a flat surface and structural support. For example, a silicon dioxide $SiO_2$ layer, silicon nitride $Si_xN_y$ layer, polysilicon layer, silicon oxynitride $Si_xO_yN_z$ layer, or a polymer layer may be used for the support layer. Alternatively, the support layer may include the same material as the first and second metal layers.

Figure 4E:
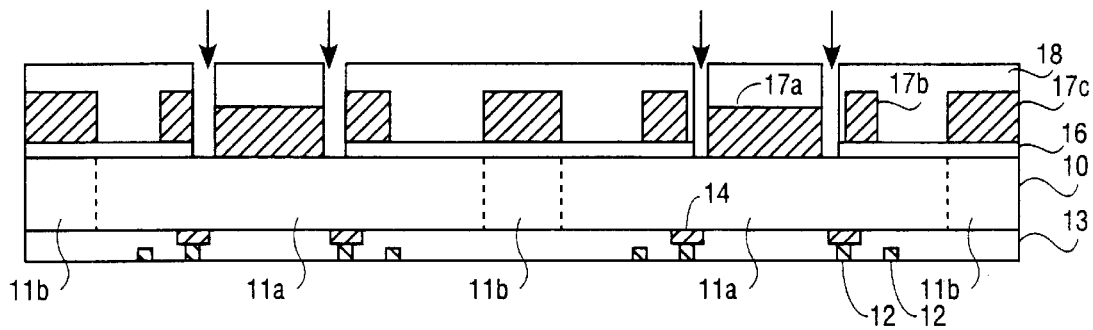

Referring to FIG. 4e, a polymer layer is formed over mirror pattern 17 and hinge pattern 16 and is patterned selectively and etched to form protection layer 18. Alternatively, a polysilicon layer, oxide layer, or nitride layer may be used to form protection layer 18. Protection layer 18 is patterned to protect mirror pattern 17 and hinge pattern 16. Protection layer 18 is also patterned such that an etching solution can reach substrate 11. For example, a hydrofluoric (HF) acid etching solution is used to etch substrate 11. Alternatively, forming protection layer 18 may be optional if mirror pattern 17 and hinge pattern 16 are resistant to the etching solution. If, for example, HF acid is used and hinge pattern 16 is made from an oxide material, which etches easily in HF acid, protection layer 18 (not made of an oxide) is then required.

Figure 4F:
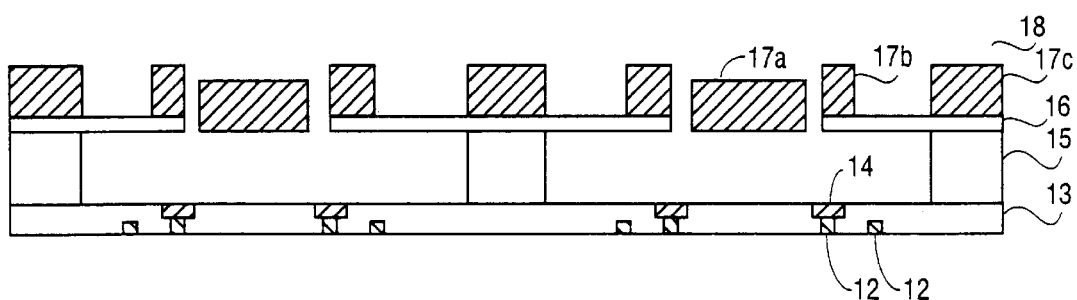

Referring to FIG. 4f, the etching solution is deposited over substrate 11 to etch substrate 11. For example, HF acid is used that etches away the exposed regions 11a more rapidly than the unexposed regions 11b such that remaining portions of the unexposed regions 11b of substrate 11 form support structure 15. If a protection layer is used, then the protection layer is removed using an oxygen plasma, wet, or dry etch process.

The thusly-fabricated MEMS mirror device serves to provide a support structure using a single substrate. The single substrate is a photosensitive substrate. For example, the photosensitive substrate is a photosensitive glass substrate that is exposed selectively. Because the photosensitive substrate is exposed selectively, the photosensitive substrate can be etched to form the support structure after forming the hinge pattern and mirror pattern. Thus, mounting a mirror pattern and a hinge pattern on a support structure is avoided. Furthermore, the thickness of the photosensitive substrate dictates the height at which a center mirror component is above the electrodes.

FIGS. 5a through 5f are cross-sectional side views illustrating process steps of a method for fabricating the MEMS mirror device according to a second embodiment.

Figure 5A:
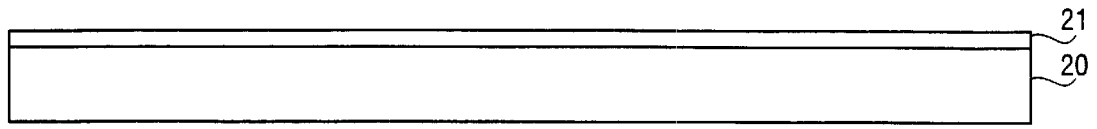
FIGS. 5a through 5f are cross-sectional side views illustrating process steps of a method for fabricating the MEMS mirror device according to a second embodiment.

Referring to FIG. 5a, a polymer layer is formed on a first substrate 20 to form a release layer 21. Release layer 21 may also be a layer that can be etched easily away or is removed easily from first substrate 20. For example, release layer 21 may be a polysilicon layer, oxide layer, or a nitride layer. First substrate 20 may be a silicon substrate, glass substrate, or a borosilicate glass substrate.

Figure 5B:
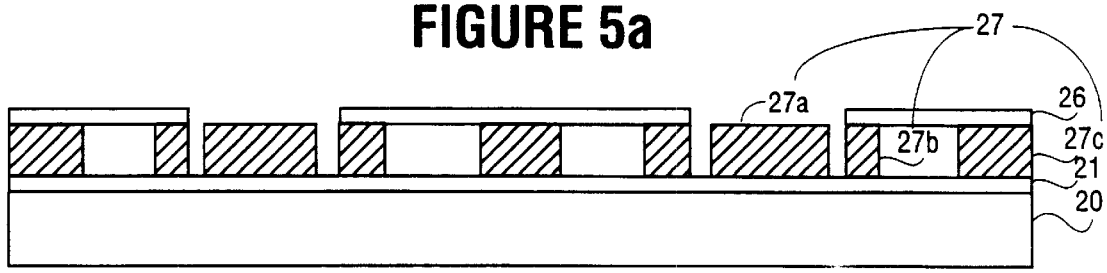

Referring to FIG. 5b, at least one layer having light reflective properties is formed on release layer 21. For example, a metal layer having light reflective properties may be formed on release layer and selectively pattern and etched to form mirror pattern 27. The metal layer may be a gold Au metal layer, aluminum Al metal layer, or a copper Cu metal layer. Mirror pattern 27 includes a center mirror component 27a, frame pattern 27b, and mirror component 27c formed on release layer 21. Alternatively, mirror component 27c may be omitted from mirror pattern 27.

Multiple layers may also be used to form mirror pattern 27. For example, a first metal layer is formed on release layer 21. A support layer is formed on the first metal layer. A second metal layer is formed on the support layer. The three layers are selectively patterned and etched to form mirror pattern 27.

The first and second metal layers are layers having light reflective properties. For example, a gold Au metal layer, an aluminum Al metal layer, or a copper Cu metal layer may be used for the first and second metal layers. The support layer is a layer that provides a flat surface and structural support. For example, a silicon dioxide $SiO_2$ layer, silicon nitride $Si_xN_y$ layer, polysilicon layer, silicon oxynitride $Si_xO_yN_z$ layer, or a polymer layer may be used for the support layer. Alternatively, the support layer may include the same material as the first and second metal layers.

After mirror pattern 27 is formed on release layer 21, a polysilicon layer is formed over mirror pattern 27 and is selectively patterned and etched to form hinge pattern 26. Alternatively, a polymer layer, oxide layer, nitride layer, silicon nitride $Si_xN_y$ layer, silicon dioxide $SiO_2$ layer, or silicon oxynitride $Si_xO_yN_z$ layer may be used that is selectively patterned and etched to form hinge pattern 26. Hinge pattern 26 is formed on portions of mirror pattern 27. Hinge pattern 26, however, is not formed on center mirror component 27a. Hinge pattern 26 is formed to be thin and flexible.

Figure 5C:
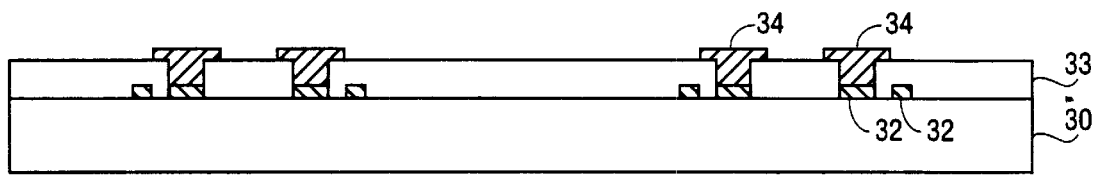

Referring to FIG. 5c, a first metal layer is formed on a second substrate 30 and is selectively patterned and etched to form wiring pattern 32. Second substrate 30 may be may be a silicon substrate, glass substrate, or borosilicate glass substrate. The first metal layer may be a metallic layer such as, for example, an aluminum Al layer. After forming wiring pattern 32, an oxide layer is then formed over wiring pattern 32 and second substrate 30 and is selectively patterned and etched to form insulation layer 33. Insulation layer 33 is formed such that portions of wiring pattern 32 are exposed. Alternatively, other dielectric layers may be used such as, for example, silicon dioxide $SiO_2$ layer, silicon nitride $Si_xN_y$ layer, or silicon oxynitride $Si_xO_yN_z$ layer, that can be selectively patterned and etched to form insulation layer 33.

After forming insulation layer 33, a second metal layer is formed over insulation layer 33 and wiring pattern 32 and is selectively patterned and etched to form electrodes 34. The second metal layer may also be a metallic layer such as, for example, an Al layer. Electrodes 34 are formed such that they are coupled with wiring pattern 32. Insulation 33 provides insulation for wiring pattern 32 and electrodes 34.

Figure 5D:
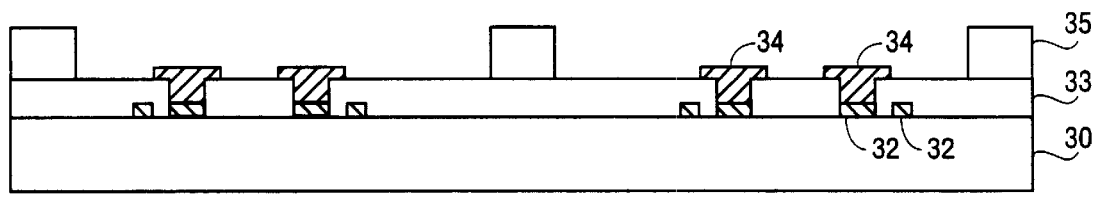

Referring to FIG. 5d, a thick patterned film is used to form support structure 35. A metal plating process is used with the thick patterned film to form support structure 35. For example, an electroless metal deposition process may be used to form support structure 35.

Initially, for the electroless metal deposition process, a thick photo resist film is formed on insulation layer 33 and selectively patterned to allow support structure 35 to be formed therein on insulation layer 33, Alternatively, a thick photo resist film may be formed on hinge pattern 26 and selectively patterned to allow support structure 35 to be formed on hinge pattern 26.

Subsequently, an aqueous solution having nickel Ni is deposited over the patterned photo resist film such that nickel Ni is formed in the patterned thick photo resist film. After Ni is formed, the remaining photo resist film is removed to form support structure 35 made of Ni. Alternatively, an aqueous solution having copper Cu or gold Au may be used to form support structure 35 using the electroless metal deposition process. The remaining photo resist film is then removed.

Alternatively, an electroplating process or a metal sputtering process may be used. For the electroplating process, a thick photo resist film is formed on insulation layer 33 and selectively patterned to allow support structure 35 to be formed therein on insulation layer 33. Alternatively, a thick photo resist film is formed on hinge pattern 26 and selectively patterned to allow support structure 35 to be formed therein on hinge pattern 26.

Subsequently, an electroplating solution having nickel Ni is deposited over the patterned photo resist film and an electric current is passed through the solution such that Ni is formed in the patterned thick photo resist film. After Ni is formed, the remaining photo resist film is removed to form support structure 35 made of Ni. Alternatively, an electroplating solution having copper Cu or gold Au may be used to form support structure 35 using the electroplating process. Depending on where the patterned photo resist film is formed, a thin conductive layer (not shown) may be formed selectively on insulation layer 33 or hinge pattern 26 to assist in the electroplating process. The photo resist film is then removed.

For the sputtering process, a thick photo resist film is formed on insulation layer 33 and selectively patterned to allow support structure 35 to be formed therein on insulation layer 33. Alternatively, a thick photo resist film is formed on hinge pattern 26 and selectively patterned to allow support structure 35 to be formed therein on hinge pattern 26.

Subsequently, metal is sputtered on the patterned thick photo resist film such that the metal is formed therein. For example, nickel Ni, copper Cu, or gold Au may be sputtered on the patterned thick photo resist film such that metal is formed therein. Subsequently, the remaining patterned thick photo resist film and metal formed thereon are removed to form support structure 35. The thick photo resist film is then removed.

Figure 5E:
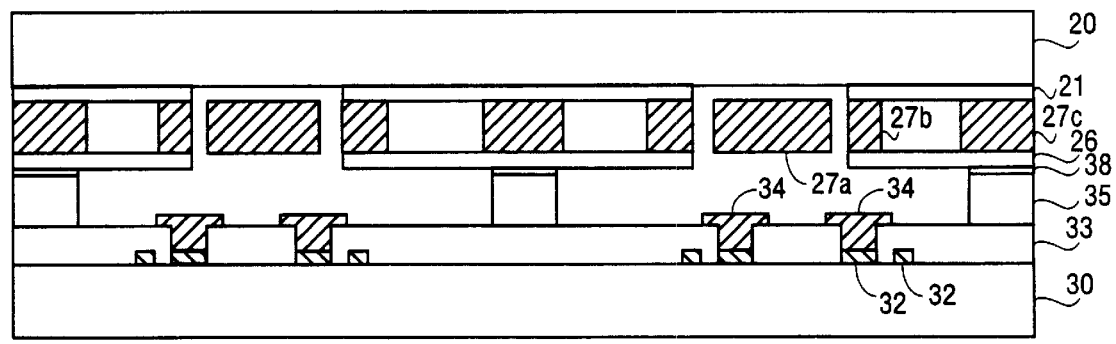

Referring to FIG. 5e, first substrate 20 is attached with second substrate 30. If support structure 35 is formed on insulation layer 33, first substrate 20 may be attached with second substrate 30 by flipping first substrate 20 and bonding hinge pattern 26 with a top side of support structure 35. Alternatively, if support structure 35 is formed on hinge pattern 26, first substrate 20 may be attached with second substrate 30 by flipping first substrate 20 and bonding support structure 35 with insulation layer 33.

Support structure 35 can be bonded to insulation layer 33 or hinge pattern 26 using a soldering bond technique that forms a bonding layer. For example, if support structure 35 is formed on insulation layer 33, a bonding layer 38 may be formed to bond support structure 35 with hinge pattern 26. Alternatively, if support structure 35 is formed on hinge pattern 26, a bonding layer may be formed near insulation layer 33 to bond support structure 35 with hinge pattern 26. The bonding layer may include a lead-tin PbSn mixture. Alternatively, a thin metal layer may be formed on hinge pattern 26 or insulation layer 33 to assist in the bonding process.

Figure 5F:
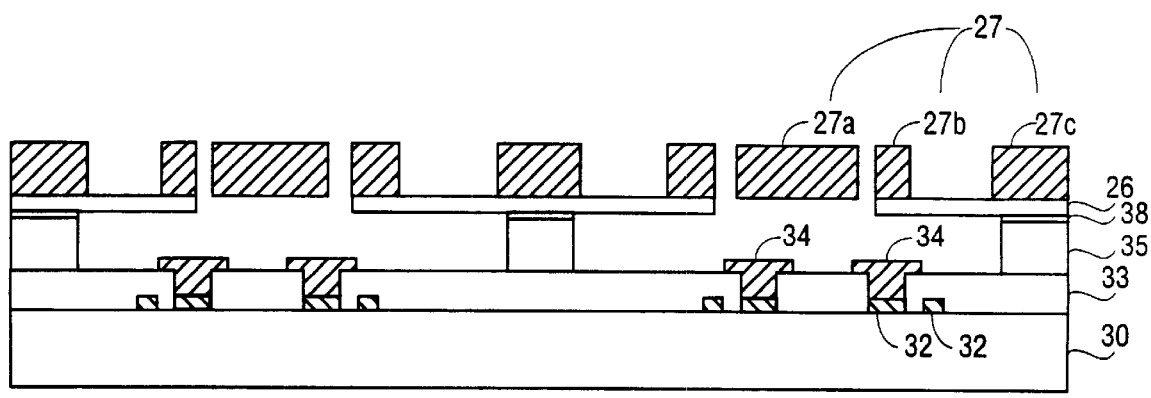

Referring to FIG. 5f, after first substrate 20 is attached with second substrate 30, first substrate 20 and release layer 21 are removed such that support structure 35 supports hinge pattern 26. Hinge pattern 26 supports mirror pattern 27. First substrate 20 may be removed using an etching or polishing process. For example, first substrate 20 may be etched away using hydro-fluoric (HF) acid or first substrate 20 may be polished away. Release layer 21 may be removed using oxygen plasma, wet etch, or a dry etch process.

The thusly fabricated MEMS mirror device serves to provide a support structure using a thick film process. In the above process, the thickness of the thick photo resist film used dictates the thickness of support structure 35. Furthermore, the thickness of support structure 35 dictates the height in which a center mirror component is above the electrodes that determines angular range of motion for the center mirror component.

FIGS. 6a through 6e are cross-sectional side views illustrating process steps of a method for fabricating the MEMS mirror device according to a third embodiment. Initially, the fabrication steps illustrated by FIG. 6a to form release layer 41, mirror pattern 47, and hinge pattern 46 are identical to the fabrication steps illustrated by FIGS. 5a and 5b for a first substrate 40 and accordingly descriptions to FIG. 6a will be omitted. Also, the fabrication steps illustrated by FIG. 6b to form wiring pattern 52, electrodes 54, and insulation layer 53 using a second substrate 50 are identical to the fabrication steps illustrated by FIG. 5c and accordingly descriptions to FIG. 6b will be omitted.

Figure 6A:
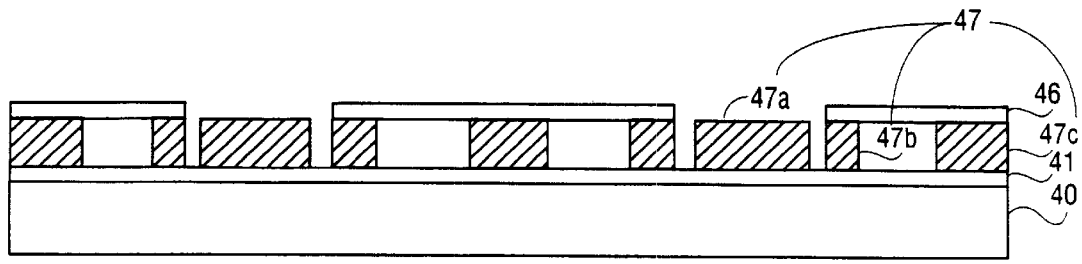
FIGS. 6a through 6f are cross-sectional side views illustrating process steps of a method for fabricating the MEMS mirror device according to a third embodiment.
Figure 6B:
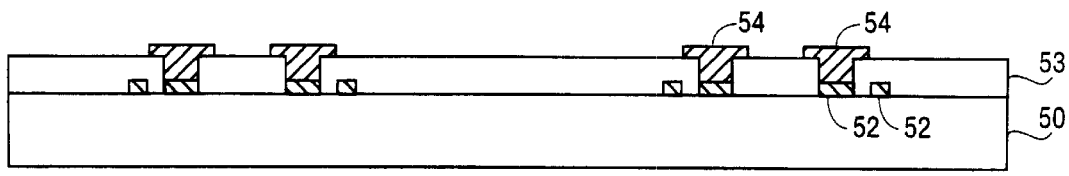
Figure 6C:
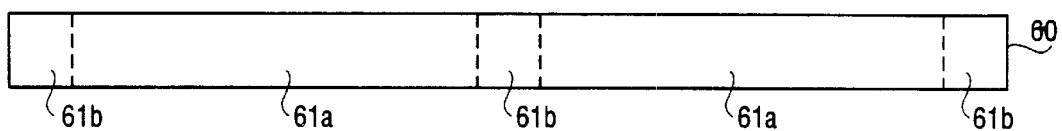
Figure 6D:

Referring to FIGS. 6c and 6d, a third substrate 60 is used to form support structure 65. Third substrate 60 may be etched selectively to form support structure 65. Third substrate may be a silicon substrate, glass substrate, or a borosilicate glass substrate. Third substrate 60 may be etched selectively in areas 61a of third substrate 60 using a reactive ion etching (RIE) process. The RIE etching process forms deep holes in third substrate 60 such that areas 61b of third substrate 60 remain to form support structure 65. Alternatively, deep holes may be formed in third substrate 60 using a wet etch or a laser ablation process such that areas 61a are removed from third substrate 60.

Third substrate 60 may also be a photosensitive substrate that is exposed selectively to form exposed regions 61a and unexposed regions 61b in third substrate 60. Third substrate 60 is a substrate that can be etched more rapidly in the exposed regions than in the unexposed regions. After being exposed selectively, third substrate 60 may be polished to retain planarity and remove any materials that may have formed on third substrate 60 during this process.

Subsequently, an etching solution is used to etch third substrate 60. For example, HF acid etching solution is deposited selectively over third substrate 60 to etch third substrate 60. The HF add etches away the exposed regions 61a more rapidly than the unexposed regions 61b such that the remaining portions of the unexposed regions 61b of third substrate 60 form support structure 65. Support structure 65 may define a honeycombed shape or define holes approximately centered with respect to center mirror components.

Figure 6E:
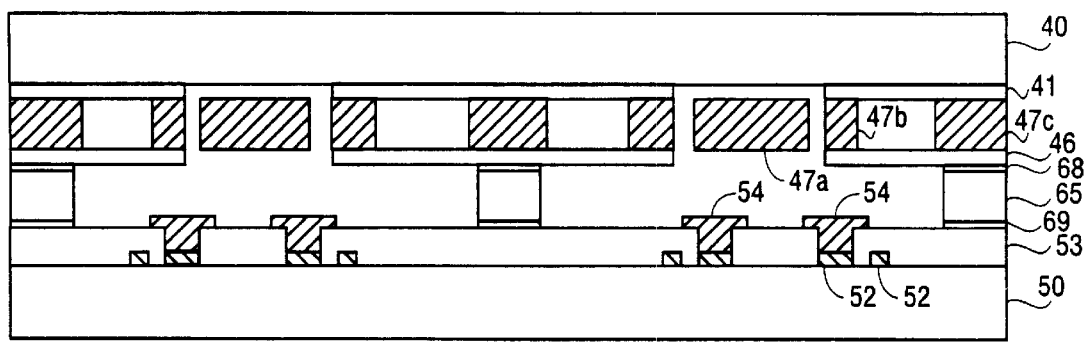

Referring to FIG. 6e, first substrate 40 is attached with second substrate 50 using support structure 65. For example, support structure 65 is bonded with insulation layer 53 using a solder bond process thus forming a bonding layer 69. Subsequently, hinge pattern 46 is bonded with support structure 65 using a solder bond process thus forming a bonding layer 68. Alternatively, support structure 65 is bonded with hinge pattern 46 using a solder bond process thus forming a bonding layer 68. Subsequently, insulation layer is bonded with support structure 65 thus forming bonding layer 69. Bonding layers 68 and 69 may include a lead-tin PbSn mixture. A thin metal layer may also be formed on insulation layer 53 and hinge pattern 46 to assist in the bonding process.

Figure 6F:
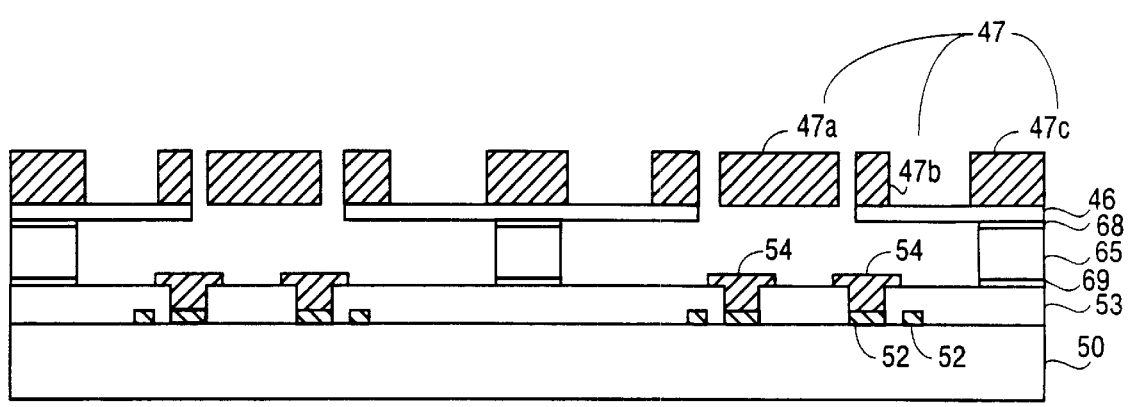

Referring to FIG. 6f, after first substrate 40 is attached with second substrate 50 using support structure 65. First substrate 40 and release layer 41 are removed such that support structure 65 supports hinge pattern 46. Hinge pattern 46 supports mirror pattern 47. First substrate 40 may be removed using an etching or polishing process. For example, first substrate 40 may be etched away using HF add or first substrate 40 may be polished away. Release layer may be removed using an oxygen plasma, wet etch, or a dry etch process.

The thusly fabricated MEMS mirror device uses three substrates. One substrate is used to form mirror pattern 47 and hinge pattern 46. A second substrate is used to form electrodes 54, and a third substrate 50 is used to form a support structure 65. The height at which the center mirror component is above the electrodes is simply dictated by the thickness of the third substrate used. Thus, to increase the height of the center mirror component above the electrodes, a thicker substrate may be used.

Figure 7A:
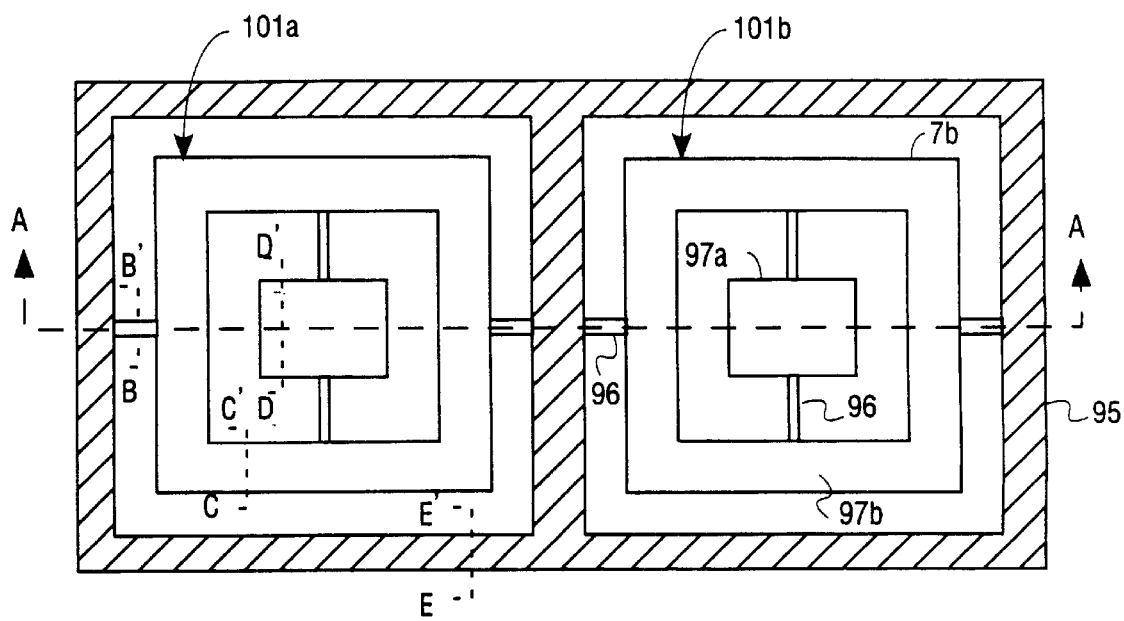
FIG. 7a is a top view of a MEMS mirror device according to another embodiment without electrodes and a wiring pattern.

FIG. 7a is a top view of a MEMS mirror device according to another embodiment without electrodes and a wiring pattern. FIG. 7a shows a first mirror device 101a and a second mirror device 101b having a support structure 95, hinge pattern 96, frame pattern 97, and mirror 97a.

Support structure 95, hinge pattern 96, frame pattern 97, and mirror 97a are all formed from a single substrate. Hinge pattern 96 provides support for frame 97b and mirror 97a. Frame 97b provides support for mirror 97a. Support structure 95 provides support for hinge pattern 96, frame pattern 97b, and mirror 97a. Mirror 97a is capable of having an angular range of motion with respect to an axis.

Figure 7B:
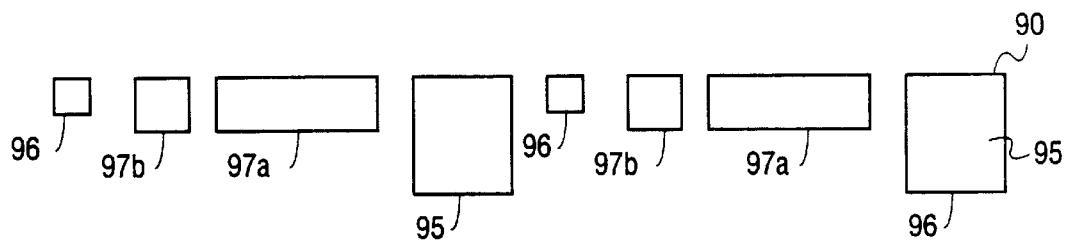
FIG. 7b is an illustration showing the cross-sectional side views along the lines B–B', C–C', D–D', and E–E' such as that shown in FIG. 7a to show the thickness and width for the hinge pattern, frame pattern, mirror, and support structure.

FIG. 7b is an illustration showing the cross-sectional side views along the lines B–B', C–C', D–D', and E–E' such as that shown in FIG. 7a to show the different thickness and width for the hinge pattern 96, frame pattern 97b, mirror 97a, and support structure 95, respectively, for first mirror 101a and second mirror 101b. Referring to FIG. 7b, along the lines B–B', C–C', and D–D', hinge pattern 96 is formed to have a smaller thickness than frame pattern 97b and mirror 97a. Alternatively, hinge pattern 96 may be formed to have the same thickness as frame pattern 97b and mirror 97a. Frame pattern 97b and mirror 97a are formed to have the same thickness.

Figure 8A:
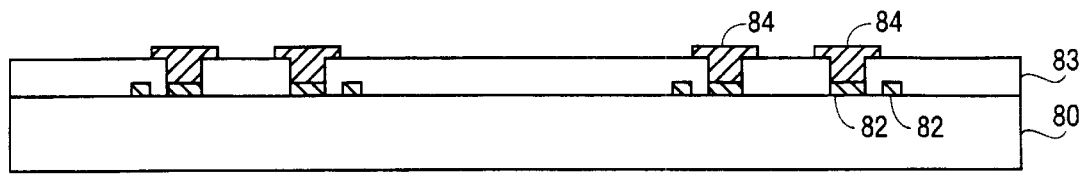
FIGS. 8a through 8f are cross-sectional side views illustrating process steps of a method for fabricating the MEMS mirror device according to a fourth embodiment.

FIGS. 8a–8f are cross-sectional side views illustrating process steps of a method for fabricating the MEMS mirror device according to the fourth embodiment. FIG. 8a illustrates the processing steps to form a wiring pattern, electrodes, insulation layer using a first substrate. Referring to FIG. 8a, the fabrication steps illustrated by FIG. 8a to form wiring pattern 82, electrodes 84, insulation layer 83 using a first substrate 80 are identical to the fabrication steps illustrated by FIGS. 5c and 6b and accordingly descriptions to FIG. 8a will be omitted.

Figure 8B:
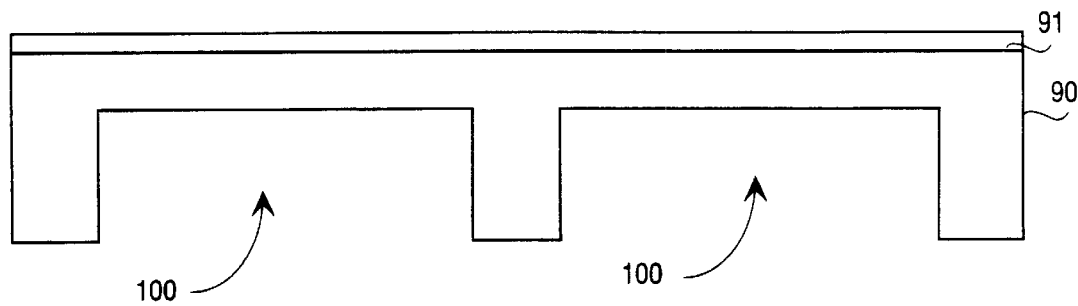
Figure 8C:
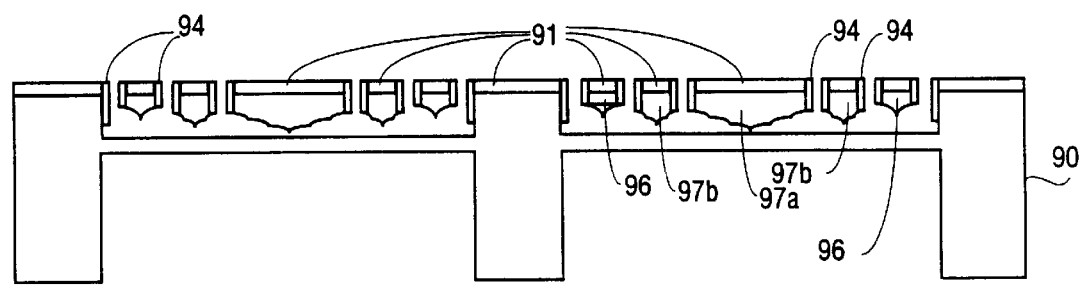
Figure 8D:
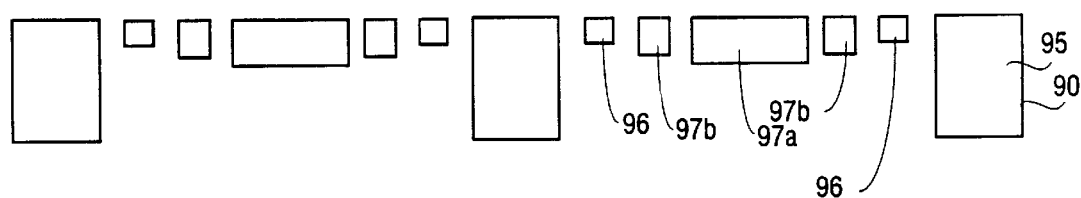

FIGS. 8b, 8c, and 8d illustrate the processing steps to form the hinge pattern, frame pattern, mirror, and support structure individually from a single substrate such as that shown in FIG. 7b. The processing steps are illustrated along the lines B–B', C–C', D–D', E–E' such as that shown in FIG. 7a for mirror device 101a and mirror device 101b.

Referring to FIG. 8b, a second substrate 90 is etched selectively on a first side to remove large portions of second substrate 90 to define open areas ("windows") 100 such that the open areas 100 are located below where hinge pattern 96, mirror 97a, and frame pattern 97b will be formed. For purposes of illustration, the first side of second substrate 90 refers to a bottom side of second substrate 90. To form open areas 100, a silicon etching process is used to etch selectively the bottom side of second substrate 90. For example, a reactive ion etching (RIE) process may be used to etch selectively a bottom side of second substrate 90 to form open areas 100. Alternatively, a wet etch or a laser ablation process may be used to etch the bottom side of second substrate 90 to form open areas 100.

An oxide layer is deposited on a second side of second substrate 90 to form a mask layer 91. Alternatively, a polymer layer, silicon nitride $Si_xN_y$ layer, silicon oxynitride $Si_xO_yN_z$ layer, or a metal layer may be used to form mask layer 91. Mask layer 91 may also be formed prior to forming open areas 100. For purposes of illustration, the second side refers to the topside of second substrate 90. Mask layer 91 is patterned to define hinge pattern 96, frame pattern 97b, mirror 97a, and support structure 95 from second substrate 90.

FIGS. 8c and 8d illustrate the processing steps for forming hinge pattern 96, frame pattern 97b, mirror 97a, and support structure 95. The following process steps describe forming hinge pattern 96 such that it has a smaller thickness than frame pattern 97b and mirror 97a. Alternatively, the following processing steps may be modified to form hinge pattern 96 having the same thickness as frame pattern 97b and mirror 97a.

Referring to FIG. 8c, mask layer 91 is patterned selectively on second substrate 90 to expose portions of second substrate 90. The patterned mask layer 91 defines hinge pattern 96, frame pattern 97b, mirror 97a, and support structure 95. The exposed portions of second substrate 90 are etched using a silicon etching process. For example, a RIE etching process may be used to etch exposed portions of second substrate 90 to a first depth such that a thin portion ("floor") of second substrate 90 remains above open areas 100. Alternatively, a wet etch or a laser ablation process may be used to etch the exposed portions of second substrate 90 to the first depth.

At this depth, an oxide layer is deposited over second substrate 90 and etched selectively to form sidewalls 94. Alternatively, a polymer layer, silicon nitride $Si_xN_y$ layer, silicon oxynitride $Si_xO_yN_z$ layer, or a metal layer may be used to form sidewalls 94. Sidewalls 94 provide protection to selective portions of the topside of second substrate 90 that define hinge pattern 96, frame pattern 97b, mirror 97a, and support structure 95, Layers that have formed on the floor in making sidewalls 94 are the etched to expose the floor.

Subsequently, exposed portions of the floor of second substrate 90 are etched using a silicon etching processes. For example, a RIE etching process may be used to etch exposed portions of the floor such that the floor falls below the sidewalls. Alternatively, a wet etch process or a laser ablation process may be used to etch the exposed portions of the floor to fall below the sidewalls. Next, a release process is performed to form hinge pattern 96, frame pattern 97b, and mirror 97a. The release process is an etching process that undercuts selectively the exposed portions of the topside of second substrate 90 that defines hinge pattern 96, frame pattern 97b, and mirror 97a underneath sidewalls 94 such that the floor is separated. If hinge pattern 96 is to have the same thickness as frame pattern 97b and mirror 97a, hinge pattern 96, frame 97b, and mirror 97a are released at the same time. Alternatively, if hinge pattern 96 is to have a smaller thickness than frame pattern 97b and mirror 97a, frame pattern 97b and mirror 97a are released after hinge pattern 96 at a lower depth.

The following step describes the release process. To release frame pattern 97b and mirror 97a at a larger depth than hinge pattern 96, the above steps are repeated such that exposed portions of the topside of second substrate 90 that define frame pattern 97b and mirror 97a underneath sidewalls 94 fall below hinge pattern 96.

A RIE etching process may be used to release the exposed portions of the topside of second substrate that defines hinge pattern 96, frame pattern 97b, and mirror 97a underneath sidewalls 94 to form hinge pattern 96, frame pattern 97b, and mirror 97a from second substrate 90. Alternatively, a time controlled profile etching process may be used to release hinge pattern 96, frame pattern 97b, and mirror 97a from second substrate 96. The release process may undercut frame pattern 97b and mirror 97a underneath sidewalls 94 such that non-straight edge surfaces are formed. Alternatively, the release process may undercut hinge pattern 96 such that non-straight edge surfaces are also formed. Hinge pattern 96, frame pattern 97b, and mirror 97a are thus formed after it has been released from second substrate 90, and the remaining mask layer 91 and sidewalls 94 are removed. Alternatively, mask layer 91 and sidewalls 94 may remain in forming the MEMS mirror device.

Referring to FIG. 8d, the next step in the process is to remove the floor ("clear the floor"). The floor is etched away to clear the floor such that hinge pattern 96, frame pattern 97b, and mirror 97a are suspended about support structure 95 and second substrate 90. For example, the floor of second substrate 90 may be etched away using an RIE etching process. Alternatively, a wet etch or a laser ablation process may be used to etch the exposed portions of the floor to clear the floor. Second substrate 90 may also be flipped and the floor may be cleared from the back side using the same etching processes. After the floor has been cleared, support structure 95 is thusly formed. For purposes of illustration, support structure 95, hinge pattern 96, frame pattern 97b, and mirror 97a are illustrated with straight surfaces, but may have non-straight edge surfaces.

Figure 8E:
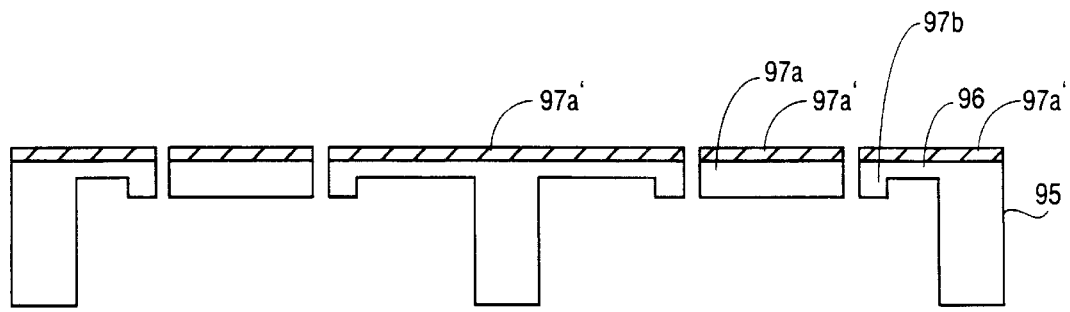

FIG. 8e is a cross-sectional side of the thusly formed hinge pattern 96, frame pattern 97b, mirror 97a, and support structure 95 taken along the line A–A' such as that shown in FIG. 7a with showing electrodes. Referring to FIG. 8e, support structure 95 provides support for hinge pattern 96, frame pattern 97b, and mirror 97a. Hinge pattern 96b provides support for frame pattern 97b. Frame pattern 97b provides support for mirror 97a.

A reflective material 97a' may then be formed on a top surface of mirror 97a. Reflective material 97a' provides a reflective surface for mirror 97a, which is used to redirect beams of light. Alternatively, reflective material 97a' may be formed on frame pattern 97b and hinge pattern 96. Reflective material 97a' includes at least one layer. For example, reflective material 97a' may include a metal layer such as, for example, a gold Au metal layer, an aluminum metal layer, or a copper Cu metal layer. Alternatively, reflective material 97a' may be formed after the processing steps as illustrated in FIG. 8e or after first substrate 80 is attached with second substrate 90.

Figure 8F:
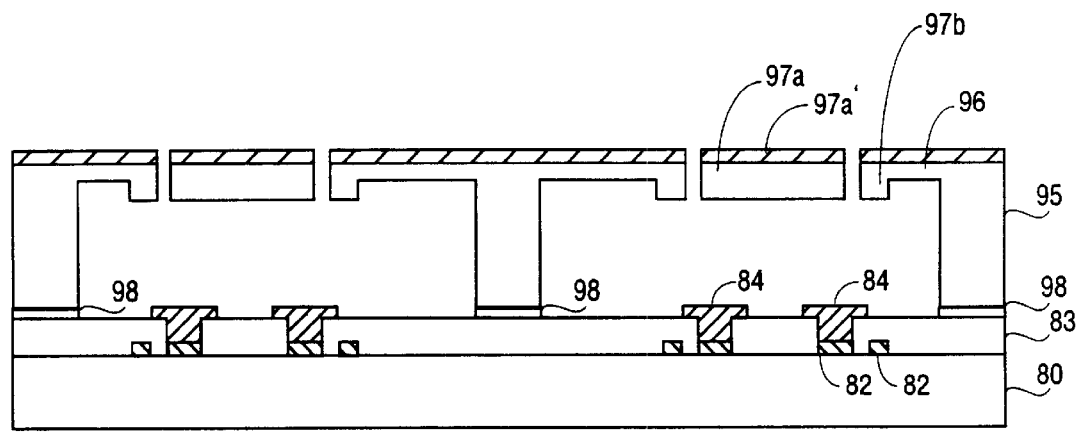

FIG. 8f illustrate attaching first substrate 80 with second substrate 90 to form the MEMS mirror device according to the fourth embodiment. Referring to FIG. 8f, first substrate 80 is attached with second substrate 90 using support structure 95. For example, support structure 95 is bonded with insulation layer 83 using a solder bond process thus forming a bonding layer 98. Bonding layer 98 may include a lead-tin PbSn mixture. A thin metal layer may also be formed on insulation layer 83 and a bottom side of support structure 95 to assist in the bonding process.

Referring to FIG. 8f, the MEMS mirror device according to the fourth embodiment includes first substrate 80, wiring pattern 82, insulation layer 83, and electrodes 84. First substrate 80, wiring pattern 82, insulation layer 83, and electrodes 84 are constructed and operate in a similar manner as substrate 1, wiring pattern 2, insulation layer 3, and electrodes 4, respectively, of FIG. 3.

The MEMS mirror device according to the fourth embodiment also includes a support structure 95, hinge pattern 96, frame pattern 97b, and mirror 97a. Support structure 95, hinge pattern 96, frame pattern 97b, and mirror 97a are made from a second substrate, which is separate from first substrate 80. The substrate to form support structure 95, hinge pattern 96, frame pattern 97b, and mirror 97a may be a single crystal silicon (SCS) substrate or a substrate in which deep holes may be formed. Support structure 95, hinge pattern 96, frame pattern 97b, and mirror 97a are formed as a single unit. Support structure 95, mirror 97a, frame pattern 97b, and hinge pattern 96 operate in a similar manner as support structure 5, center mirror component 7a, frame pattern 7b, and hinge pattern 6, respectively, of FIG. 3.

The thusly fabricated MEMS mirror device uses two substrates. One substrate is used to form electrodes 84, wiring pattern 82, and insulation layer 83. A second substrate is used to form support structure 95, mirror 97a, hinge pattern 96, and frame pattern 97b. The height at which the mirror is above the electrodes is simply dictated by the thickness of the second substrate used. Thus, to increase the height of the of the center mirror component above the electrodes, a thicker second substrate may be used. Also, the mirror, frame pattern, and hinge pattern are formed without using thin film layering, which reduces the number of processing steps.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A micro-electro-mechanical-system (MEMS) mirror device fabrication method, comprising:
   exposing selectively a substrate to form exposed regions and unexposed regions;
   forming electrodes supported by the substrate;
   forming a mirror pattern having a center mirror component and a hinge pattern supported by the substrate; and
   removing portions of the substrate in the exposed regions to form a support structure from the unexposed regions such that the support structure supports the mirror pattern and hinge pattern.

2. The fabrication method of claim 1, wherein the substrate is a photosensitive glass substrate.

3. The fabrication method of claim 2, wherein exposing selectively a substrate exposes selectively the photosensitive glass substrate to form exposed regions such that the center mirror component is approximately centered of the exposed regions.

4. The fabrication method of claim 3, further comprising:
   polishing the photo sensitive glass substrate after exposing selectively the photo sensitive glass substrate to retain planarity and remove any materials formed thereon.

5. The fabrication method of claim 3, wherein removing portions of the substrate includes:
   etching selectively using an etching solution the exposed regions of the photosensitive glass substrate.

6. The fabrication method of claim 5, wherein the etching solution is hydro-fluoric HF acid and wherein the HF add etches more rapidly in the exposed regions than in the unexposed regions.

7. The fabrication method of claim 5, wherein etching selectively includes:
   forming a protection layer over the mirror pattern and hinge pattern such that portions of the photosensitive glass substrate are exposed to allow the etching solution to reach the exposed regions of the photosensitive glass substrate; and
   depositing the etching solution over the photosensitive glass such that the etching solution reaches the exposed regions of the photosensitive glass to form the support structure from the unexposed regions of the photosensitive glass.

8. The fabrication method of claim 7, further including:
   removing the protection layer.

9. The fabrication method of claim 1, wherein forming the mirror pattern forms a frame pattern such that the hinge pattern supports the frame pattern.

10. The fabrication method of claim 1, wherein forming the mirror pattern forms a frame pattern and a mirror component such that the hinge pattern supports the frame pattern and mirror component.

11. The fabrication method of claim 1, wherein a thickness of the support structure is capable of exceeding a thickness of 50 $\mu$m.

12. The fabrication method of claim 1, wherein the mirror pattern includes at least one layer.

13. The fabrication method of claim 12, wherein the mirror pattern includes a gold Au metal layer, an aluminum Al metal layer, or a copper cu metal layer.

14. The fabrication method of 12, wherein forming a mirror pattern includes:
   forming a first metal layer;
   forming a support layer on the first metal layer; and
   forming a second metal layer on the support layer.

15. The fabrication method of claim 14, wherein the first and second metal layers are a gold Au metal layer, aluminum Al metal layer, or copper Cu metal layer.

16. The fabrication method of claim 14, wherein the support layer is a silicon dioxide $SiO_2$ layer, silicon nitride $Si_xN_y$ layer, polysilicon layer, silicon oxynitride $Si_xO_yN_z$ layer, or polymer layer.

17. The fabrication method of claim 1, further comprising:
   forming a wiring pattern such that the wiring pattern is coupled with the electrodes;
   forming an insulation layer such that the insulation layer insulates the wiring pattern and electrodes.

18. A micro-electro-mechanical-system (MEMS) mirror device fabrication method, comprising:
   forming a release layer on a first substrate;
   forming a mirror pattern having a center mirror component and a hinge pattern supported by the release layer;
   forming electrodes supported by a second substrate;
   forming a support structure;
   attaching the first substrate with the second substrate using the support structure;
   removing the first substrate and the release layer such that the support structure supports the hinge pattern and mirror pattern.

19. The fabrication method of claim 18, wherein forming a support structure forms the support structure such that the support structure is supported by the second substrate.

20. The fabrication method of claim 19, wherein forming a support structure includes;
   forming a bond with a topside of the support structure with the hinge pattern supported by the first substrate such that the first substrate is attached with the second substrate.

21. The fabrication method of claim 18, wherein forming a support structure forms the support structure such that the support structure is supported by the first substrate.

22. The fabrication method of claim 21, wherein forming a support structure includes:
   forming a bond with a topside of the support structure with the second substrate such that first substrate is attached with the second substrate.

23. The fabrication method of claim 18, wherein forming the support structure uses a thick patterned film.

24. The fabrication method of claim 23, wherein forming the support structure uses an electroless, electro-plating, or a sputtering process with the thick patterned film to form the support structure.

25. The fabrication method of claim 24, wherein the thickness of the thick patterned film dictates the thickness of the support structure.

26. The fabrication method of claim 25, wherein forming the support structure uses nickel Ni, copper Cu, gold Au, or aluminum Al.

27. The fabrication method of claim 18, wherein the release layer is a polymer layer, oxide layer, or a nitride layer.

28. The fabrication method of claim 27, wherein removing the first substrate and release layer includes:
   etching away the first substrate using an etching solution; and
   applying oxygen plasma to react with the release layer such that the release layer is removed from the mirror pattern.

29. The fabrication method of claim 27, wherein removing the release layer includes:
   etching away the release layer such that the release layer is removed from the mirror pattern.

30. The fabrication method of claim 18, wherein the first substrate is a silicon substrate, glass substrate, or borosilicate glass substrate.

31. The fabrication method of claim 18, wherein forming a mirror pattern forms a frame pattern supported by the release layer.

32. The fabrication method of claim 18, wherein forming a mirror pattern forms a frame pattern and a mirror component supported by the release layer.

33. The fabrication method of claim 18, wherein the mirror pattern includes at least one layer.

34. The fabrication method of claim 33, wherein the mirror pattern includes a gold Au metal layer, an aluminum Al metal layer, or a copper Cu metal layer.

35. The fabrication method of claim 33, wherein forming a mirror pattern includes:
    forming a first metal layer on the release layer;
    forming a support layer on the first metal layer; and
    forming a second metal layer on the support layer.

36. The fabrication method of claim 35, wherein the first and second metal layers are a gold Au metal layer, aluminum Al metal layer, or copper Cu metal layer.

37. The fabrication method of claim 36, wherein the support layer is silicon dioxide $SiO_2$ layer, silicon nitride $Si_xN_y$ layer, polysilicon layer, silicon oxynitride $Si_xO_yN_z$ layer, or polymer layer.

38. The fabrication method of claim 18, further comprising:
    forming a wiring pattern such that the wiring pattern is coupled with the electrodes; and
    forming an insulation layer insulating the wiring pattern and electrodes.

39. A micro-electro-mechanical-system (MEMS) mirror device fabrication method, comprising:
    forming a release layer on a first substrate;
    forming a mirror pattern having a center mirror component and a hinge pattern supported by the release layer;
    forming electrodes supported by a second substrate;
    forming a support structure using a third substrate;
    attaching the first substrate with the second substrate using the support structure;
    removing the first substrate and release layer.

40. The fabrication method of claim 39, wherein the release layer is a polymer layer, oxide layer, or a nitride layer.

41. The fabrication method of claim 40, wherein removing the first substrate and release layer includes:
    etching away the first substrate using an etching solution, and
    applying oxygen plasma to react with the release layer such that the release layer is removed from the mirror pattern.

42. The fabrication method of claim 40, wherein removing the release layer includes:
    etching away the release layer such that the release layer is removed from the mirror pattern.

43. The fabrication method of claim 39, wherein forming a mirror pattern forms a frame pattern supported by the release layer.

44. The fabrication method of claim 39, wherein forming a mirror pattern forms a frame pattern and a mirror component supported by the release layer.

45. The fabrication method of claim 39, wherein the mirror pattern includes at least one layer.

46. The fabrication method of claim 45, wherein the mirror pattern includes a gold Au metal layer, an aluminum Al metal layer, or a copper Cu metal layer.

47. The fabrication method of claim 45, wherein forming a mirror pattern includes:
    forming a first metal layer;
    forming a support layer on the first metal layer; and
    forming a second metal layer on the support layer.

48. The fabrication method of claim 47, wherein the first and second metal layers are a gold Au metal layer, aluminum Al metal layer, or copper Cu metal layer.

49. The fabrication method of claim 47, wherein the support layer is silicon dioxide $SiO_2$ layer, silicon nitride $Si_xN_y$ layer, polysilicon layer, silicon oxynitride $Si_xO_yN_z$ layer, or polymer layer.

50. The fabrication method of claim 39, wherein the third substrate is a silicon substrate or a photosensitive glass substrate.

51. The fabrication method of claim 50, wherein forming a support structure includes:
    exposing selectively the photosensitive glass substrate to form exposed regions and unexposed regions in the photosensitive glass substrate; and
    removing portions of the photosensitive glass substrate in the exposed regions to form the support structure from the unexposed regions such that the support structure supports the hinge pattern and mirror pattern.

52. The fabrication method of claim 50, wherein forming a support structure includes:
    etching deep holes in the silicon substrate such that the remaining portions of the silicon substrate form the support structure.

53. The fabrication method of claim 39, wherein a thickness of the third substrate dictates the thickness of the support structure, and wherein the thickness of the support structure is capable of exceeding a thickness of 50 μm.

54. The fabrication method of claim 39, further comprising:
    forming a wiring pattern such that the wiring pattern is coupled with the electrodes; and
    forming an insulation layer insulating the wiring pattern and electrodes.

55. A micro-electro-mechanical-system (MEMS) mirror device fabrication method, comprising:
    forming electrodes supported by a first substrate;
    removing selectively portions of a second substrate on a bottom side;
    removing selectively portions of the second substrate on a topside to form a mirror pattern, frame pattern, hinge pattern, and support structure; and
    attaching the first substrate with the second substrate.

56. The fabrication method of claim 55, wherein the second substrate is a silicon substrate or a single-crystal silicon substrate.

57. The fabrication method of claim 55, wherein removing selectively portions of a second substrate on a bottom side includes:
    etching selectively the bottom side of the second substrate using an reactive ion etching RIE process, wet etch process, or a laser ablation process.

58. The fabrication method of claim 55, further comprising:
    forming at least one layer on the mirror.

59. The fabrication method of claim 58, wherein the at least one layer is a gold Au metal layer, aluminum Al metal layer, or a copper Cu metal layer.

60. The fabrication method of claim 55, further comprising: forming at least one layer on the mirror and frame pattern.

61. The fabrication method of claim 60, wherein the at least one layer is a gold Au metal layer, aluminum Al metal layer, or a copper Cu metal layer.

62. The fabrication method of claim 55, wherein the hinge pattern is formed such that the hinge pattern has a smaller thickness than the mirror and frame pattern.

63. The fabrication method of claim 62, wherein removing selectively portions of the second substrate on a topside to form the hinge pattern includes:

releasing the hinge pattern from the second substrate such that the hinge pattern is supported by the support structure.

64. The fabrication method of claim 63, wherein removing selectively portions of the second substrate on a topside to form the mirror and the frame pattern includes:

releasing the mirror and the frame pattern from the second substrate such that frame pattern is supported by the hinge pattern and the mirror is supported by the frame pattern.

65. The fabrication method of claim 55, wherein the hinge pattern, the mirror, and frame pattern have the same thickness.

66. The fabrication method of claim 65, wherein removing selectively portions of the second substrate on a topside to form the hinge pattern, mirror, and frame pattern include:

releasing the hinge pattern, mirror, and frame pattern from the second substrate such that the hinge pattern is supported by the support structure, the frame pattern is supported by the hinge pattern, and the mirror is supported by the frame pattern.

67. The fabrication method of claim 55, wherein a thickness of the support structure is capable of exceeding a thickness of 50 $\mu$m.

68. The fabrication method of claim 55, further comprising:

forming a wiring pattern such that the wiring pattern is coupled with the electrodes; and forming an insulation layer insulating the wiring pattern and electrodes.

\* \* \* \* \*